United States Patent
Matsui et al.

(10) Patent No.: US 8,305,788 B2
(45) Date of Patent: Nov. 6, 2012

(54) SEMICONDUCTOR MEMORY DEVICE

(75) Inventors: Masaru Matsui, Yokohama (JP);
Mayumi Furuta, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 212 days.

(21) Appl. No.: 12/817,877

(22) Filed: Jun. 17, 2010

(65) Prior Publication Data

US 2011/0051488 A1  Mar. 3, 2011

(30) Foreign Application Priority Data

Aug. 28, 2009 (JP) ................................ 2009-197903

(51) Int. Cl.
*G11C 5/06* (2006.01)

(52) U.S. Cl. ....... 365/63; 365/51; 365/149; 365/189.07; 365/189.08; 365/189.011

(58) Field of Classification Search ..................... 365/51, 365/63, 230.03, 154
See application file for complete search history.

(56) References Cited

U.S. PATENT DOCUMENTS

| | | | |
|---|---|---|---|
| 5,761,109 A * | 6/1998 | Takashima et al. | 365/63 |
| 6,314,042 B1 * | 11/2001 | Tomishima et al. | 365/230.03 |
| 6,992,928 B2 * | 1/2006 | Inoue | 365/185.08 |
| 2008/0094869 A1 * | 4/2008 | Osada et al. | 365/51 |

FOREIGN PATENT DOCUMENTS

JP      10-326873 A    12/1998

* cited by examiner

*Primary Examiner* — Pho M Luu
*Assistant Examiner* — Thao Bui
(74) *Attorney, Agent, or Firm* — Sughrue Mion, PLLC

(57) ABSTRACT

A semiconductor memory device to an exemplary aspect of the present invention includes a plurality of memory cells, a plurality of word lines, a plurality of bit line pairs, a plurality of column selectors, a common signal line pair including one common line commonly connected to one of each of the plurality of bit line pairs, and the other common line commonly connected to the other of each of the plurality of bit line pairs, a sense amplifier amplifying the potential difference of the common signal line pair, and a plurality of capacitance adding circuits that balance with parasitic capacitances of the column selectors which are not selected, the capacitance adding circuits being provided respectively between the one of each of the bit line pairs and the other common line and between the other of each of the bit line pairs and the one common line.

12 Claims, 12 Drawing Sheets

POTENTIAL OF SELECTED WORD LINE

POTENTIAL OF SELECTED BIT LINES

POTENTIAL OF NON-SELECTED BIT LINES

POTENTIAL OF READ LINES

RELATED ART
Fig. 9A
POTENTIAL OF
SELECTED WORD
LINE
Fig. 9B
POTENTIAL OF
SELECTED BIT
LINES
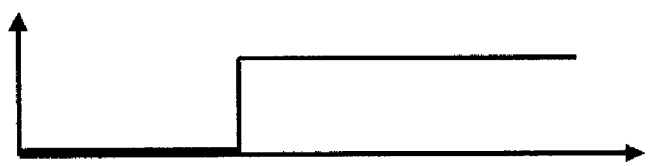
Fig. 9C
POTENTIAL OF
NON-SELECTED BIT
LINES
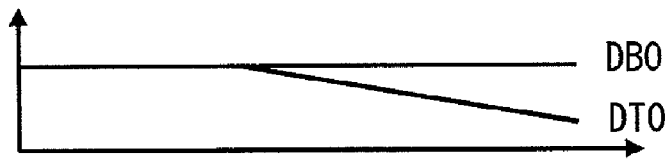
Fig. 9D
POTENTIAL OF
READ LINES

POTENTIAL OF SELECTED WORD LINE

POTENTIAL OF SELECTED BIT LINES

POTENTIAL OF NON-SELECTED BIT LINES

POTENTIAL OF READ LINES

POTENTIAL OF
SELECTED WORD
LINE

POTENTIAL OF
BIT LINE BL1

POTENTIAL OF
BIT LINE BL2

GATE POTENTIAL OF
TRANSISTOR T15

GATE POTENTIAL OF
TRANSISTOR T16

SEMICONDUCTOR MEMORY DEVICE

INCORPORATION BY REFERENCE

This application is based upon and claims the benefit of priority from Japanese patent application No. 2009-197903, filed on Aug. 28, 2009, the disclosure of which is incorporated herein in its entirety by reference.

BACKGROUND

1. Field of the Invention

The present invention relates to a semiconductor memory device, and more particularly, to a semiconductor memory device suitable for noise reduction.

2. Description of Related Art

In recent years, low voltage and high speed techniques have been advanced in systems equipped with an ASIC (Application Specific Integrated Circuit) product. Also, in the field of SRAMs of a semiconductor memory device provided in the ASIC product, the low voltage and high speed techniques have been required. Therefore, miniaturization of semiconductor processes is advancing.

Along with the miniaturization of semiconductor processes, capacitances of bit lines which select memory cells for storing data and capacitances of signal lines (for examples read lines) which connect between a selected bit line and a sense amplifier for reading out data become smaller. Therefore, the ratio between the total capacitance of the bit lines and read lines, and the coupling capacitance of these lines under the effect of the other lines becomes larger. Thus, a countermeasure to reduce the effect of the coupling capacitance on the performance of the SRAM circuit has been required (for example, see Japanese Unexamined Patent Application Publication No. 10-326873).

FIG. 8 is a block diagram showing a semiconductor memory device according to the related art. The circuit shown in FIG. 8 includes m×n (m and n are natural numbers) number of memory cells MC00 to MC(m−1)(n−1), n number of precharge circuits PC0 to PC(n−1), n number of column selectors CSR0 to CSR(n−1), a precharge circuit PCs, and a sense amplifier SA.

The memory cells MC00 to MC(m−1)(n−1) are arranged at nodes between word lines WLs and bit line pairs DT/DBs. The memory cells MC00 to MC(m−1)(n−1) are arranged in a matrix. Note that the word lines WLs include word lines WL0 to WL(m−1). The bit line pairs DT/DBs include bit line pairs DT0/DB0 to DT(n−1)/DB(n−1).

Memory cell groups arranged in n columns are connected to a common read line pair YDT/YDB through the corresponding precharge circuits PC0 to PC(n−1) and the corresponding column selectors CSR0 to CSR(n−1). The sense amplifier SA amplifies a potential difference of the read line pair YDT/YDB and outputs the amplified potential difference as readout data from one of the memory cells.

For example, a case is explained in which the memory cell MC00 is selected. First, all the bit line pairs are precharged. Next, the word line WL0 is selected (FIG. 9A). Then, the potentials of all the bit line pairs change according to charges stored in the memory cells connected to the word line WL0 (FIGS. 9B and 9C). Further, the bit line pair DT0/DB0 is selected by the column selector CSR0.

When the bit line pair DT0/DB0 is selected, the potential of the bit line DT0 is transmitted to the read line YDT (YDT shown in FIG. 9D) and is input to one input terminal of the sense amplifier SA. Further, the potential of the bit line DB0 is transmitted to the read line YDB (YDB shown in FIG. 9D) and is input to the other input terminal of the sense amplifier SA. The sense amplifier SA amplifies the potential difference of the read line pair YDT/YDB, thereby reading out data from the memory cell MC00.

In the circuit shown in FIG. 8, different parasitic capacitances are added to the read lines YDT and YDB in accordance with the potential variations of the bit line pairs in non-selected columns (for example, the bit line pair DT(n−1)/DB(n−1)). Specifically, the read line YDT is connected to the bit lines DT0 to DT(n−1). When the bit line DT0 is selected (DT0 shown in FIG. 10B), the potential of the read line YDT mainly reflects the potential of the bit line DT0. However, the parasitic capacitances of the bit lines DT1 to DT(n−1) are also added to the read line YDT (YDT shown in FIG. 10D) because the read line YDT is connected to the bit lines DT1 to DT(n−1) which are not selected (see FIG. 10C). Similarly, the read line YDB is connected to the bit lines DB0 to DB(n−1). When the bit line DB0 is selected (DB0 shown in FIG. 10B), the potential of the read line YDB mainly reflects the potential of the bit line DB0. However, the parasitic capacitances of the bit lines DB1 to DB(n−1) are also added to the read line YDB (YDB shown in FIG. 10D) because the read line YDB is connected to the bit lines DB1 to DB(n−1) which are not selected (see FIG. 10C).

The potential differences between the bit lines DT and DB vary depending on data (0 or 1) stored in each corresponding memory cell. Therefore, the effects of the parasitic capacitances added from the non-selected bit lines to the read line pair YDT/YDB are different from each other. At worst, it becomes impossible to read out data accurately because the potential difference of the bit line pair DT/DB depending on the data stored in the memory cell MC00 decreases under the effect of these parasitic capacitances (see FIG. 10D). Otherwise, it is necessary to set a considerably large margin for reading out the data. Therefore, the circuit shown in FIG. 8 has a problem that it is impossible to read out data accurately.

A solution to this problem is disclosed in, for example, Japanese Unexamined Patent Application Publication No. 10-326873. FIG. 11 illustrates a semiconductor integrated circuit disclosed in Japanese Unexamined Patent Application Publication No. 10-326873. The circuit shown in FIG. 11 includes a common bit line BL connected to each of bit lines (BL1, BL2), and a reference bit line KBL charged with a reference potential to determine the potential of the bit line BL. The bit line BL and the reference bit line KBL are provided with dummy elements to set the parasitic capacitance of the bit line BL to be substantially equal to the parasitic capacitance of the reference bit line KBL. This makes it possible to improve the noise-resistant performance.

However, switch elements may generate an unintended parasitic capacitance. Specifically, the circuit shown in FIG. 11 also includes a number of switch elements which connect each bit line (BL1, BL2) to the common bit line BL. The switch elements in non-selected columns include parasitic capacitances. Moreover, the parasitic capacitance of each switch element is influenced by the potential of the corresponding bit line, so that the value of the parasitic capacitance is unstable. Therefore, there arises a problem that cannot be solved by the method used in the circuit shown in FIG. 11 which adds the parasitic capacitance of the dummy elements to the reference of reading out data.

A description is given of a problem that may occur in the circuit shown in FIG. 11, when the data read out to the bit line BL1 is "H", the data read out to the bit line BL2 is "L", and the data of the bit line BL1 is read out.

In this case, a gate potential of a transistor T15 indicates the potential of the bit line BL1 (see FIG. 12B). However, the gate potential of the transistor T15 (see FIG. 12D) changes in accordance with the potential variation of the bit line BL2 (see FIG. 12C) under the effect of the parasitic capacitances existing between the source and the drain of the transistors T9 and T10. In other words, noise occurs in the gate potential of the transistor T15 in accordance with the potential of the bit line BL2 which is not selected. Specifically, the data read out to the bit line BL2 is "L", so that the gate potential of the transistor T15 decreases compared to the case where the noise has a small effect (see FIG. 12D). Note that the gate terminal of the transistor T15 and the drain terminal (which outputs an output signal DO) of the transistor T16 are connected to each other through a capacitor C1. Therefore, a potential applied to one terminal of the capacitor C1 decreases in accordance with a decrease in the gate potential of the transistor T15. Then, the potential of the output signal DO decreases. That is, the circuit shown in FIG. 11 has a problem that it is impossible to read out data accurately.

SUMMARY

The present inventors have found a problem that it is impossible for the circuit according to the related art to accurately read out data.

An exemplary aspect of the present invention is a semiconductor memory device including:

a plurality of memory cells arranged in a matrix;

a plurality of word lines each connected to the plurality of memory cells arranged in rows;

a plurality of bit line pairs each connected to the plurality of memory cells arranged in columns;

a plurality of column selectors each provided for the corresponding bit line pair;

a common signal line pair including one common line commonly connected to one of each of the plurality of bit line pairs, and the other common line commonly connected to the other of each of the plurality of bit line pairs;

a sense amplifier having an input terminal connected to the one common line, and the other input terminal connected to the other common line; and a plurality of capacitance adding circuits that balance with parasitic capacitances of the column selectors which are not selected, the capacitance adding circuits being provided respectively between the one of each of the bit line pairs and the other common line and between the other of each of the bit line pairs and the one common line.

According to the circuit configuration as above, it is possible to read out data accurately.

According to the circuit configuration as above, it is possible to provide the semiconductor memory device capable of reading out data accurately.

BRIEF DESCRIPTION OF THE DRAWINGS

The above and other exemplary aspects, advantages and features will be more apparent from the following description of certain exemplary embodiments taken in conjunction with the accompanying drawings, in which:

FIGS. 9A to 9D illustrate ideal potential variations of bit lines and read lines during reading of data;

DETAILED DESCRIPTION OF THE EXEMPLARY EMBODIMENTS

Figure 1:
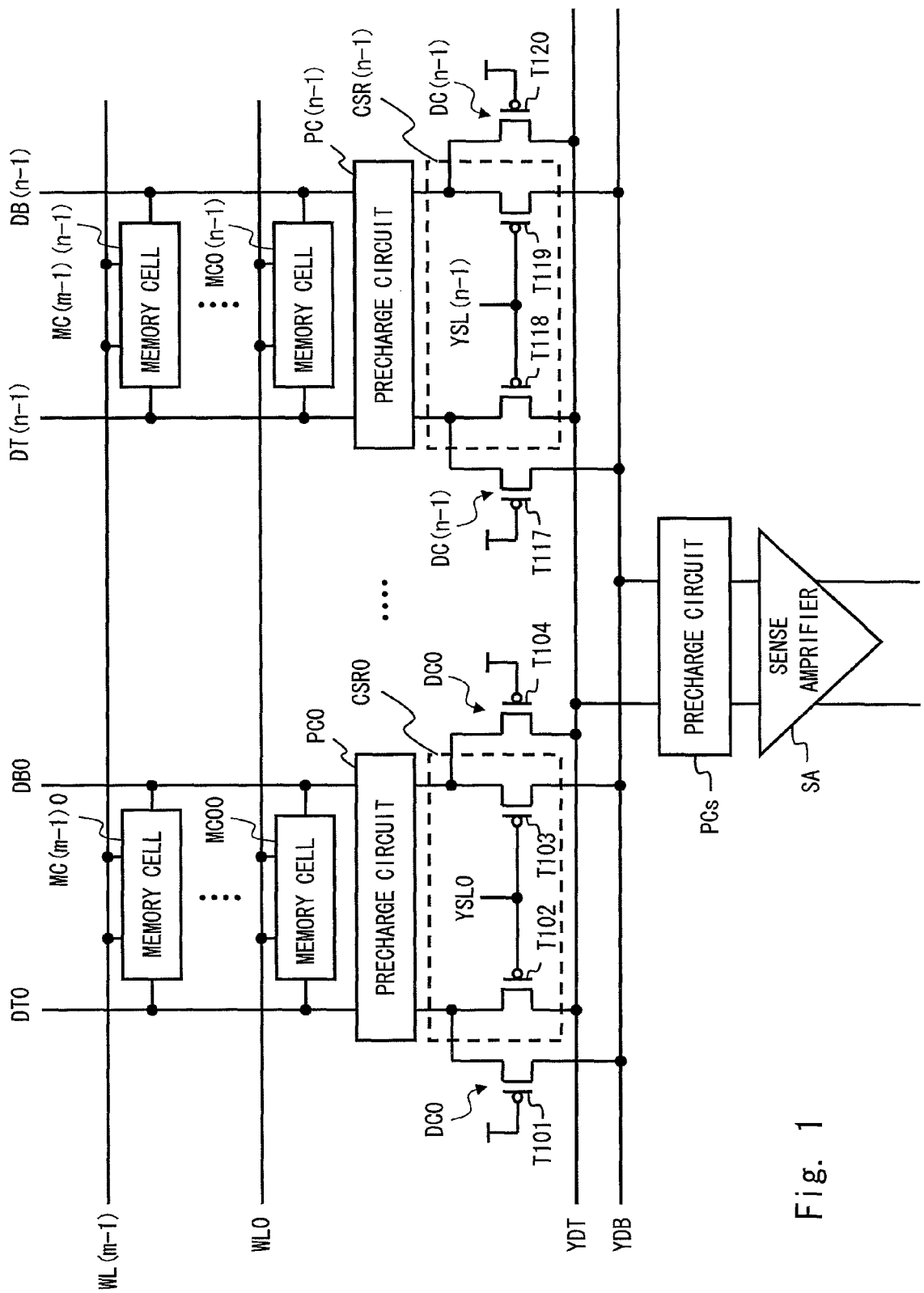
FIG. 1 is a block diagram illustrating a semiconductor memory device according to a first exemplary embodiment of the present invention.

Specific exemplary embodiments of the present invention are described in detail below with reference to the drawings. The same components are denoted by the same reference numerals in the drawings, and for clarity of explanation, repeated explanation is omitted as appropriate.

First Exemplary Embodiment

Referring to FIG. 1, a semiconductor memory device according to a first exemplary embodiment of the present invention will be described. FIG. 1 is a block diagram showing a semiconductor memory device according to the first exemplary embodiment of the present invention. The circuit shown in FIG. 1 includes m×n (m and n are natural numbers) number of memory cells MC00 to MC(m−1)(n−1), n number of precharge circuits PC0 to PC(n−1), n number of column selectors CSR0 to CSR(n−1), n number of capacitance adding circuits DC0 to DC(n−1), a precharge circuit PCs, and a sense amplifier SA. Note that, in the circuit shown in FIG. 1, the memory cells MC00 to MC(m−1)(n−1) arranged in m rows×n columns constitute a memory cell array. Specifically, n columns of memory cells are arranged in the transverse direction (row direction) in FIG. 1, and m rows of memory cells are arranged in the longitudinal direction (column direction) in FIG. 1. The memory cells MC00 to MC(m−1)(n−1) are arranged in a matrix and constitute a memory cell array.

The memory cells MC00 to MC(m−1)(n−1) are arranged at nodes between word lines WLs and bit line pairs DT/DBs. The m×n number of memory cells MC00 to MC(m−1)(n−1) are arranged in a matrix. Note that the word lines WLs include word lines WL0 to WL(m−1). The bit line pairs DT/DBs include bit line pairs DT0/DB0 to DT(n−1)/DB(n−1).

First, connections between the memory cell group arranged in each column and corresponding peripheral circuits are explained. Note that the same circuit configuration is used for each column. Therefore, connections between the memory cells MC00 to MC(m−1) arranged in the $0^{th}$ column and the corresponding peripheral circuits are mainly explained.

The memory cell MC00 is arranged at a node between the word line WL0 in the $0^{th}$ row and the bit line pair DT0/DB0 in the $0^{th}$ column. The memory cell MC(m−1)$^{th}$ is arranged at a node between the word line WL(m−1) in the (m−1)$^{th}$ row and the bit line pair DT0/DB0 in the $0^{th}$ column. In the manner, the m number of memory cells MC00 to MC(m−1)$^{th}$ are arranged at the respective nodes between the m number of word lines WL0 to WL(m−1) and the bit line pair DT0/DB0 in the $0^{th}$ column. Note that the bit line DT0 is a true side of the bit line pair DT0/DB0 connected to the memory cells MC00 to MC(m−1) arranged in the $0^{th}$ column. The bit line DB0 is a bar side of the bit line pair DT0/DB0 connected to the memory cells MC00 to MC(m−1) arranged in the $0^{th}$ column.

Similarly, the m number of memory cells MC0(n−1) to MC(m−1)(n−1) are arranged at the respective nodes between the m number of word lines WL0 to WL(m−1) and the bit line pair DT(n−1)/DB(n−1) in the (n−1)$^{th}$ column.

The bit line pair DT0/DB0 is connected to a read line pair (common signal line pair) YDT/YDB through the precharge circuit PC0 and the column selector CSR0. Similarly, the bit line pair DT(n−1)/DB(n−1) is connected to the read line pair YDT/YDB through the precharge circuit PC(n−1) and the column selector CSR(n−1). In this manner, the memory cell groups arranged in n columns are connected to the common read line pair YDT/YDB through the corresponding precharge circuits PC0 to PC(n−1) and the corresponding column selectors CSR0 to CSR(n−1).

The read lines YDT and YDB are respectively connected to input terminals of the sense amplifier SA through the precharge circuit PCs for the sense amplifier. An output terminal of the sense amplifier SA is connected to an external output terminal of the semiconductor memory device. That is, the sense amplifier SA amplifies a potential difference of the read line pair YDT/YDB and outputs the amplified potential difference as readout data from one of the memory cells.

The column selector CSR0 includes a transistor (first switch element) T102 for selecting a column, and a transistor (second switch element) T103 for selecting a column. In this exemplary embodiment, an example where the transistors T102 and T103 are P-channel MOS transistors will be described.

The transistor T102 has a drain terminal connected to the bit line DT0, a gate terminal is connected to a column selecting signal YSL0, and a source terminal connected to the read line YDT. The transistor T103 has a drain terminal connected to the bit line DB0, a gate terminal connected to the column selecting signal YSL0, and a source terminal connected to the read line YDB.

The capacitance adding circuit DC0 includes a dummy transistor (first capacitive element) T101 and a dummy transistor (second capacitive element) T104. In this exemplary embodiment, an example where the transistors T101 and T104 are P-channel MOS transistors will be described.

The transistor T101 has a drain terminal connected to the bit line DT0, a gate terminal connected to a high potential side power supply terminal VDD, and a source terminal connected to the read line YDB. The transistor T104 has a drain terminal connected to the bit line DB0, a gate terminal connected to the high potential side power supply terminal VDD, and a source terminal connected to the read line YDT. In this case, the high potential side power supply VDD is applied to the gate terminals of the transistors T1 and T4. Therefore, a current flowing between the source and drain of the transistors T1 and T4 is controlled to be always off.

Similarly, the column selector CSR(n−1) includes transistors T118 and T119 for selecting a column. The capacitance adding circuit DC(n−1) includes dummy transistors T117 and T120. The circuit configurations of the column selector CSR(n−1) and the capacitance adding circuit DC(n−1) are the same as those of the column selector CSR0 and the capacitance adding circuit DC0, so the description thereof is omitted. Note that the transistors T117, T118, T119, and T120 correspond to the transistors T101, T102, T103, and T104 respectively.

In the semiconductor memory device according to this exemplary embodiment, the parasitic capacitance added to the read line YDT is set to be equal to the parasitic capacitance added to the read line YDB. Specifically, the semiconductor memory device according to this exemplary embodiment is provided with the capacitance adding circuits DC0 to DC(n−1) so that the total parasitic capacitance between the bit line pairs DT/DBs and the read line YDT becomes substantially equal to the total parasitic capacitance between the bit line pairs DT/DBs and the read line YDB.

Figure 2:
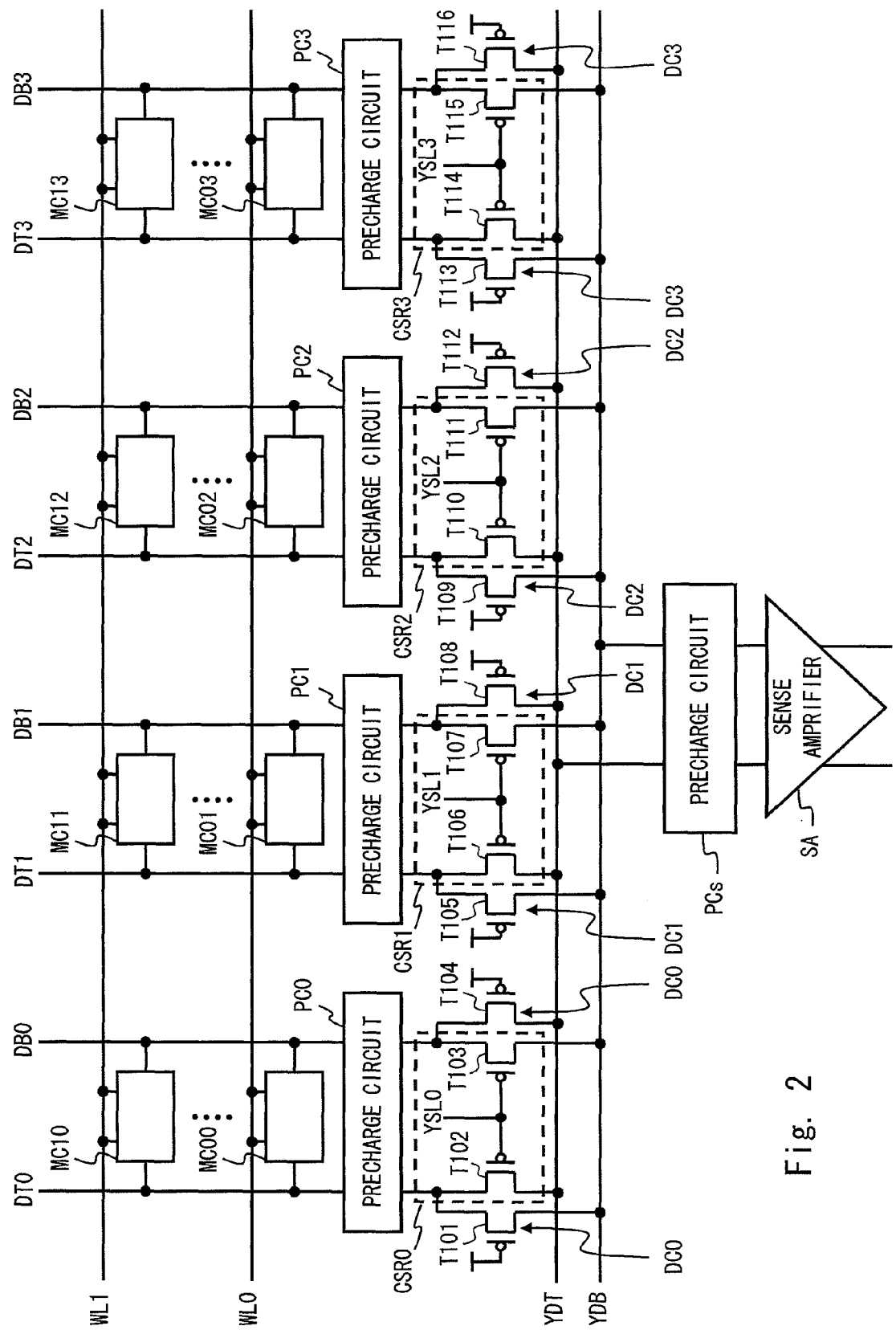
FIG. 2 is a block diagram illustrating the semiconductor memory device according to the first exemplary embodiment of the present invention.

The capacitance adding circuits DC0 to DC(n−1) will be described in detail. The circuit shown in FIG. 2 is an example of the circuit configuration which includes a memory cell array including memory cells arranged in two rows and four columns, and a sense amplifier shared by the memory cells. That is, the circuit shown in FIG. 2 is an example of the circuit configuration in a case where "m" is set to 2 and "n" is set to 4 in the circuit shown in FIG. 1. The remaining circuit configuration is similar to that of the circuit shown in FIG. 1, and therefore the explanation is omitted.

The exemplary circuit shown in FIG. 2 includes dummy transistors T101, T104, T105, T108, T109, T112, T113, and T116 as capacitance adding circuits DC0 to DC3. These dummy transistors are controlled to be off because the high potential side power supply VDD is applied to the gate terminal as described above.

Note that the transistors T101 and T102 have substantially the same size (dimensions). The transistors T103 and T104 have substantially the same size (dimensions). That is, the transistors having a drain terminal connected to a common bit line are substantially the same size. The transistors T105 and T106, the transistors T107 and T108, the transistors T109 and T110, the transistors T111 and T112, the transistors T113 ant T114, and the transistors T115 and T116 also have substantially the same size.

That is, each transistor for selecting a column and the corresponding dummy transistor have substantially the same size. Thus, the parasitic capacitance existing between the source and the drain of each transistor for selecting a column which is in off state is substantially equal to the parasitic capacitance existing between the source and the drain of the corresponding dummy transistor. The source terminal of each transistor for selecting a column and the source terminal of the corresponding dummy transistor are connected to the respective read lines (YDT, YDB). The drain terminal of each transistor for selecting a column and the drain terminal of the corresponding dummy transistor are each connected to the common bit line.

For example, assume that the bit line pair DT1/DB1 is not selected. In this case, noise of the parasitic capacitance due to the effect of the transistor T106 is superimposed on the read line YDT. Further, noise of the parasitic capacitance due to the effect of the transistor T105 is superimposed on the read line YDB. Similarly, noise of the parasitic capacitance due to the effect of the transistor T107 is superimposed on the read line YDB. Further, noise of the parasitic capacitance due to the effect of the transistor T108 is superimposed on the read line YDT. The remaining non-selected bit line pairs (for example, DT2/DB2, DT3/DB3) have a relation similar to that of the bit line pair DT1/DB1.

Figure 3A:
FIGS. 3A to 3D illustrate potential variations of bit lines and read lines during reading of data of the semiconductor memory device according to the first exemplary embodiment of the present invention.
Figure 3B:
Figure 3C:
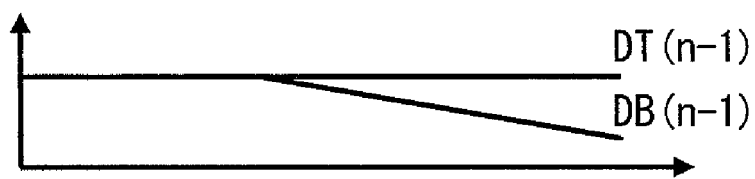

The operation of the semiconductor memory device according to this exemplary embodiment will now be described. A description is given of the case where the data stored in the memory cell MC00 is read out. First, the potential of the word line WL0 selected by a row decoder (not shown) changes to H level (see FIG. 3A). In response to this, the data stored in the memory cells MC00 to MC03 connected to the word line WL0 is transmitted to the corresponding bit line pairs DT0/DB0 to DT3/DB3 (see FIGS. 3B and 3C). Next, the column selecting signal YSL0 changes to L level. In response to this, the transistors T102 and T103 are turned on. Then, the data of the bit line pair DT0/DB0 is transmitted to the read line pair YDT/YDB (see FIG. 3D).

The memory data held in the read line pair YDT/YDB is input to the sense amplifier SA through the precharge circuit PCs. The sense amplifier SA amplifies the received memory data (potential difference of the read line pair YDT/YDB) and outputs the amplified data as readout data.

In this case, the potential of the read line YDT changes (noise occurs on the read YDT; YDT shown in FIG. 3D) according to the potential variation of the bit lines DT1, DT2, and DT3 under the effect of the parasitic capacitances existing between the source and the drain of the transistors T106, T110, and T114 which are not selected. Similarly, the potential of the read line YDB changes (noise occurs on the read line YDB; YDB shown in FIG. 3D) according to the potential variation of the bit lines DB1, DB2, and DB3 under the effect of the parasitic capacitances existing between the source and the drain of the transistors T107, T111, and T115 which are not selected. That is, the potential of the read line pair YDT/YDB changes according to the potential variation of the bit line pairs DT1/DB1 to DT3/DB3 in the columns which are not selected.

The operation executed between the bit line pair DT1/DB1 which is not selected and the read line pair YDT/YDB will now be described. The bit line pair DT1/DB1 is not selected, so that a column selecting signal YSL1 changes to H level. In response to this, the transistors T106 and T107 are turned off. Therefore, the memory data held in the bit line pair DT1/DB1 is not transmitted to the read line pair YDT/YDB. In this case, the parasitic capacitance existing between the source and the drain of each of the transistors T106 and T107 is substantially equal to the parasitic capacitance existing between the source and the drain of each of the corresponding dummy transistors T105 and T108.

The potential variation of the bit line DT1 is transferred to the read line YDT through the parasitic capacitance existing between the source and the drain of the transistor T106 for selecting a column. At the same time, the potential variation of the bit line DT1 is transferred to the read line YDB through the parasitic capacitance existing between the source and the drain of the dummy transistor T105. Similarly, the potential variation of the bit line DB1 is transferred to the read line YDB through the parasitic capacitance existing between the source and the drain of the transistor T107 for selecting a column. At the same time, the potential variation of the bit line DB1 is transferred to the read line YDT through the parasitic capacitance existing between the source and the drain of the dummy transistor T108.

That is, the parasitic capacitance existing between the bit line DT1 and the read line YDT matches the parasitic capacitance existing between the bit line DT1 and the read line YDB. Further, the parasitic capacitance existing between the bit line DB1 and the read line YDB matches the parasitic capacitance existing between the bit line DB1 and the read line YDT.

Figure 4:
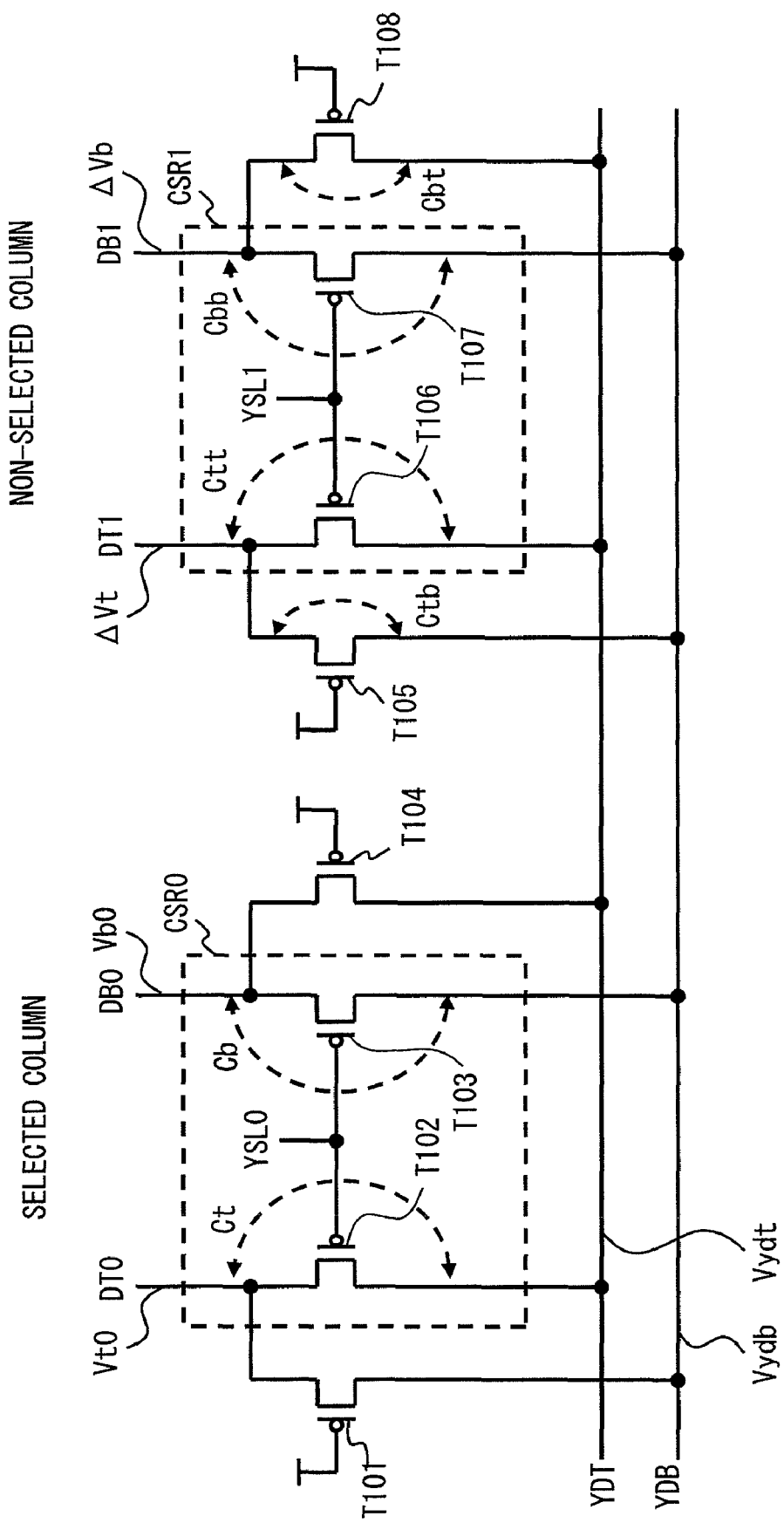
FIG. 4 illustrates a column selector of the semiconductor memory device according to the first exemplary embodiment of the present invention.

The operation of offsetting noise by the capacitance adding circuit will now be described using operational expressions. FIG. 4 illustrates the column selectors CSR0 and CSR1 for two columns shown in FIG. 2 and the corresponding capacitance adding circuits DC0 and DC1. Note that, in the example of the circuit shown in FIG. 4, the $0^{th}$ column is selected and the $1^{st}$ column is not selected. It is assumed herein that the parasitic capacitance existing between the bit line DT0 and the read line YDT is denoted by Ct, the parasitic capacitance existing between the bit line DB0 and the read line YDB is denoted by Cb. It is also assumed herein that the parasitic capacitance existing between the bit line DT1 and the read line YDT is denoted by Ctt, the parasitic capacitance existing between the bit line DT1 and the read line YDB is denoted by Ctb. It is further assumed herein that the parasitic capacitance existing between the bit line DB1 and the read line YDB is denoted by Cbb, the parasitic capacitance existing between the bit line DB 1 and the read line YDT is denoted by Cbt.

Assume that the potential of the bit line DT0 is denoted by Vt0, and the potential of the bit line DB0 is denoted by Vb0. Also assume that the potential variations of the DT1 and DB1 which cause noise are denoted by ΔVt and ΔVb, respectively, and the number of non-selected columns is k (k=n−1). In this exemplary embodiment, Ctt=Ctb and Cbb=Cbt are established.

A potential Vydb of the read line YDB can be expressed as the following expression (1). Further, the expression (1) can be expressed as the following expression (2).

$$Vydb=\{(Cb+Cbb\times k+Ctb\times k)\times Vb0-Cbb\times k\times \Delta Vb-Ctb\times k\times \Delta Vt\}/(Cb+Cbb\times k+Ctb\times k) \quad (1)$$

$$Vydb=Vb0-k(Cbb\times \Delta Vb-Ctb\times \Delta Vt)/(Cb+Cbb\times k+Ctb\times k) \quad (2)$$

Similarly, the potential Vydt of the read line YDT can be expressed as the following expression (3).

$$Vydt=Vt0-k(Cbt\times \Delta Vb-Ctt\times \Delta Vt)/(Cb+Cbb\times k+Ctb\times k) \quad (3)$$

From the expressions (2) and (3), the potential difference of the read line pair YDT/YDB can be expressed as the following expression (4). Further, the expression (4) can be expressed as the following expression (5).

$$Vydb-Vydt=Vb0-k(Cbb\times \Delta Vb-Ctb\times \Delta Vt)/(Cb+Cbb\times k+Ctb\times k)-Vt0+k(Cbt\times \Delta Vb-Ctt\times \Delta Vt)/(Cb+Cbb\times k+Ctb\times k) \quad (4)$$

$$Vydb-Vydt=Vb0-Vt0-k\{(Cbb-Cbt)\times \Delta Vb+(Ctb-Ctt)\times \Delta Vb\}/(Cb+Cbb\times k+Ctb\times k) \quad (5)$$

Ctt=Ctb and Cbb=Cbt are established, so that the expression (5) can be expressed as the following expression (6).

$$Vydb-Vydt=Vb0-Vt0 \quad (6)$$

Figure 3D:
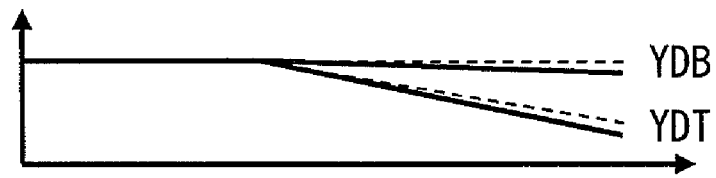

As is clear from the expression (6), the potential difference of the read line pair YDT/YDB input to the sense amplifier SA in the case where the bit lines in the non-selected columns vary is the same as that in the case where no noise occurs (see FIG. 3D). That is, the read line pair YDT/YDB offsets noise from the bit line pairs in the non-selected columns. Consequently, the semiconductor memory device according to an exemplary embodiment of the present invention makes it possible to read out data accurately.

Further, each transistor for selecting a column and each dummy transistor are P-channel MOS transistors. Thus, the semiconductor memory device according to an exemplary embodiment of the present invention makes is possible to provide the same layout pattern for these transistors. That is, the parasitic capacitances of these transistors can be easily matched.

As described above, when the parasitic capacitance added to the read line YDT matches the parasitic capacitance added to the read line YDB, the potential variation of the bit line DT1 induces noise equally in the read lines YDT and YDB. At the same time, the potential variation of the bit line DB1 induces noise equally in the read lines YDT and YDB. In short, the potential variation of each bit line induces noise equally in the read lines YDT and YDB. Therefore, the noises are offset with each other. The same is true in the case of the other bit line pairs DT2/DB2 and DT3/DB3 in non-selected columns. In other words, regardless of the potential variation of the bit lines in non-selected columns, the potential difference between the read lines YDT and YDB is equal to that in the case where no noise occurs. Therefore, the semiconductor memory device according to an exemplary embodiment of the present invention can read out data accurately.

Figure 5:
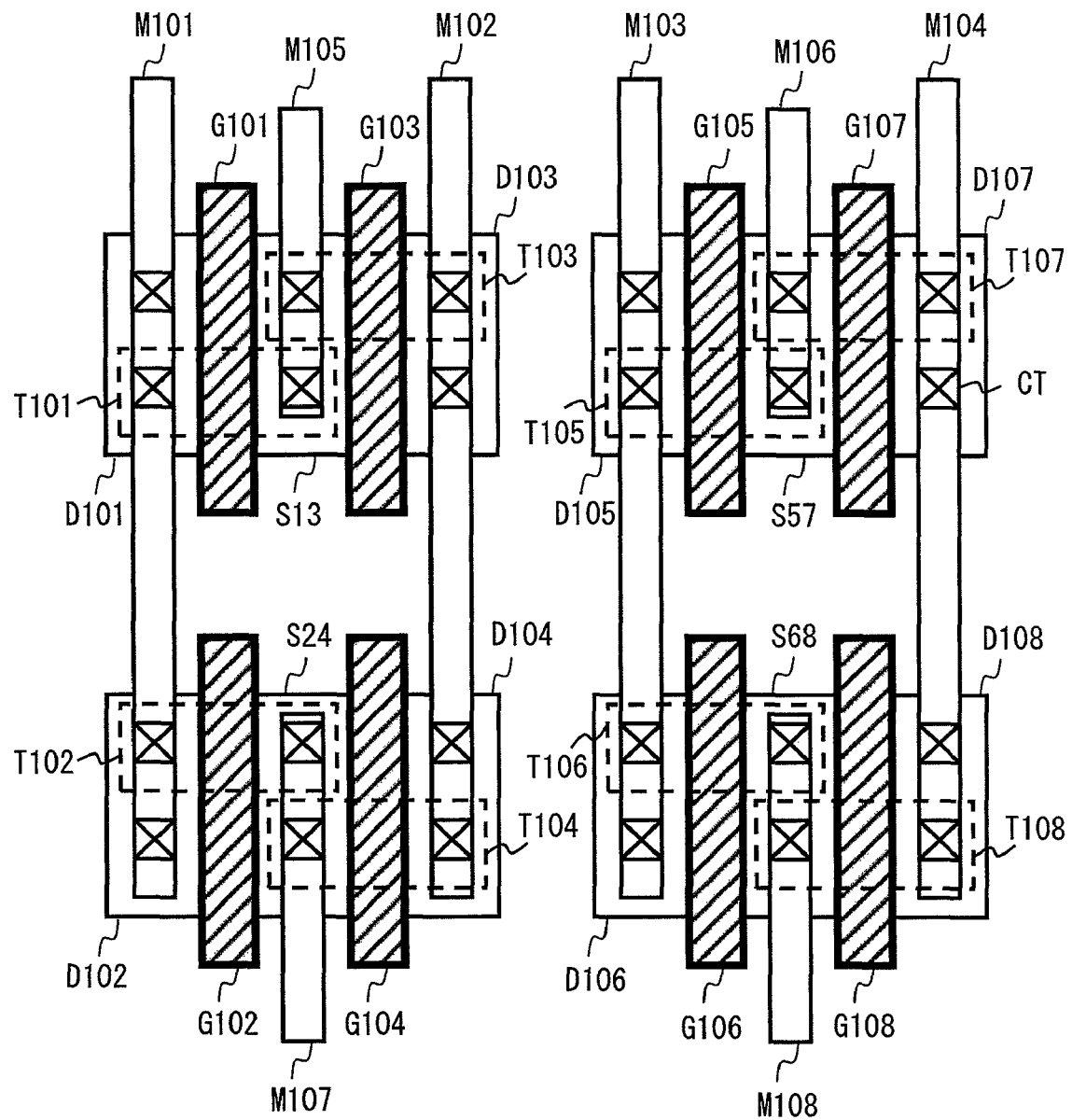
FIG. 5 illustrates a layout pattern of the semiconductor memory device according to the first exemplary embodiment of the present invention.

Next, an example of a specific layout pattern for use in actually mounting the semiconductor memory device according to the first exemplary embodiment will now be described. FIG. 5 illustrates a layout pattern of the column selectors for two columns and the corresponding capacitance adding circuits (for example, the column selectors CSR0 and CSR1 and the capacitance adding circuits DC0 and DC1) in the circuit shown in FIG. 2. The transistor T102 is composed of a gate G102 serving as the gate terminal, a source S24 serving as the source terminal, and a drain D102 serving as the drain terminal. The transistor T103 is composed of a gate G103 serving as the gate terminal, a source S13 serving as the source terminal, and a drain D103 serving as the drain terminal. The transistor T106 is composed of a gate G106 serving as the gate terminal, a source S68 serving as the source terminal, and a drain D106 serving as the drain terminal. The transistor T107 is composed of a gate G107 serving as the gate terminal, a source S57 serving as the source terminal, and a drain D107 serving as the drain terminal. The transistor T101 is composed of a gate G101 serving as the gate terminal, the source S13 serving as the source terminal, and a drain D101 serving as the drain terminal. The transistor T104 is composed of a gate G104 serving as the gate terminal, the source S24 serving as the source terminal, and a drain D104 serving as the drain terminal. The transistor T105 is composed of a gate G105 serving as the gate terminal, the source S57 serving as the source terminal, and a drain D105 serving as the drain terminal. The transistor T108 is composed of a gate G108 serving as the gate terminal, the source S68 serving as the source terminal, and a drain D108 serving as the drain terminal.

The source S13 is shared by the transistors T103 and T101. The source S24 is shared by the transistors T102 and T104. The source S57 is shared by the transistors T107 and T105. The source S68 is shared by the transistors T106 and T108.

The sources S24 and S68 are connected to the read line YDT (not shown) respectively through metal wirings M107 and M108 via contacts CT. The sources S13 and S57 are connected to the read line YDB (not shown) respectively through metal wirings M105 and M106 via the contacts CT. The drains D101 and D102 are connected to the bit line DT0 (not shown) through a common metal wiring M101 via the contacts CT. The drains D103 and D104 are connected to the bit line DB0 (not shown) through a common metal wiring M102 via the contacts CT. The drains D105 and D106 are connected to the bit line DT1 (not shown) through a common metal wiring M103 via the contacts CT. The drains D107 and D108 are connected to the bit line DB1 (not shown) through a common metal wiring M104 via the contacts CT.

The gates G102 and G103 are connected to the column selecting signal YSL0 (not shown). The gates G106 and G107 are connected to the column selecting signal YSL1 (not shown). The gates G101, G104, G105, and G108 are connected to the high potential side power supply terminal VDD. As described above, the use of the same layout pattern for the column selectors and the dummy transistors makes it possible to easily match the parasitic capacitances of these transistors.

Second Exemplary Embodiment

The first embodiment has described the example where the switch elements composed of the column selectors and the capacitance adding circuits are P-channel MOS transistors. On the other hand, in a second embodiment of the present invention, a case is explained in which each switch element composed of the column selectors and the capacitance adding circuits is a transfer gate composed of a P-channel MOS transistor and an N-channel MOS transistor. Further, in the second embodiment, a case is explained in which the semiconductor memory device includes circuits which are used for both read operation and write operation.

Figure 6:
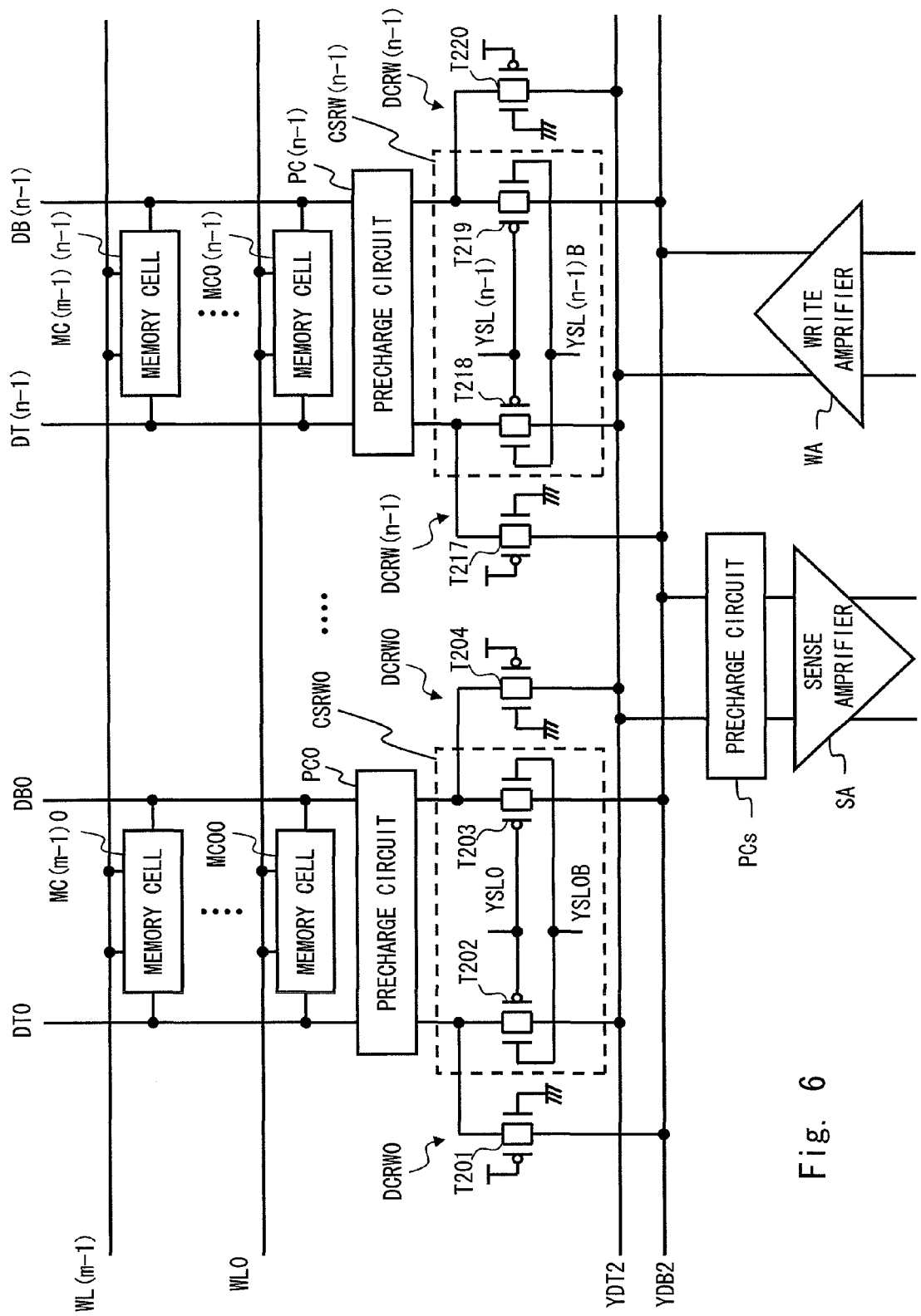
FIG. 6 is a block diagram illustrating a semiconductor memory device according to a second exemplary embodiment of the present invention.

FIG. 6 is a block diagram illustrating a semiconductor memory device according to the second exemplary embodiment of the present invention. The circuit shown in FIG. 6 includes an IO line pair (common signal line pair) YDT2/YDB2 for read and write operations in place of the read line pair YDT/YDB shown in FIG. 1. The circuit shown in FIG. 6 includes column selectors CSRW0 to CSRW(n−1) in place of the column selectors CSR0 to CSR(n−1). The circuit shown in FIG. 6 includes capacitance adding circuits DCRW0 to DCRW(n−1) in place of the capacitance adding circuits DC0 to DC(n−1). The circuit shown in FIG. 6 further includes a write amplifier circuit (write control circuit) WA which outputs write data to the IO line pair YDT2/YDB2. The remaining circuit configuration is similar to that of the circuit shown in FIG. 1, and therefore the explanation is omitted.

The column selector CSRW0 includes transfer gates T202 and T203 for selecting column, in place of the transistors T102 and T103 for selecting column shown in FIG. 1. The capacitance adding circuit DCRW0 includes dummy transfer gates T201 and T204 in place of the dummy transistors T101 and T104 shown in FIG. 1. Note that each transfer gate is composed of a P-channel MOS transistor and an N-channel MOS transistor.

In the transfer gate T202, the drain terminal is connected to the bit line DT0, the gate terminal on the P-channel side is connected to the column selecting signal YSL0, the gate terminal on the N-channel side is connected to a column selecting signal YSL0B, and the source terminal is connected to the IO line YDT2. Note that the column selecting signal YSL0B has an opposite phase to the column selecting signal YSL0. In the transfer gate T203, the drain terminal is connected to the bit line DB0, the gate terminal on the P-channel side is connected to the column selecting signal YSL0, the gate terminal on the N-channel side is connected to the column selecting signal YSL0B, and the source terminal is connected to the IO line YDB2.

In the transfer gate T201, the drain terminal is connected to the bit line DT0, the gate terminal on the P-channel side is connected to the high potential side power supply terminal VDD, the gate terminal on the N-channel side is connected to a low potential side power supply terminal GND, and the source terminal is connected to the IO line YDB2. In the transfer gate T204, the drain terminal is connected to the bit line DB0, the gate terminal on the P-channel side is connected to the high potential side power supply terminal VDD, the gate terminal on the N-channel side is connected to the low potential side power supply terminal GND, and the source terminal is connected to the IO line YDT2. In this case, in each of the transfer gates T201 and T204, a current flowing between the source and the drain is controlled to be off because the high potential side power supply VDD is applied to the gate terminal on the P-channel side and the low potential side power supply GND is applied to the gate terminal on the N-channel side.

Similarly, the column selector CSRW(n−1) includes transfer gates T218 and T219 for selecting column, in place of the transistors T118 and T119 for selecting column shown in FIG. 1. The capacitance adding circuit DCRW(n−1) includes dummy transfer gates T217 and T220 in place of the dummy transistors T117 and T120 shown in FIG. 1. Note that each transfer gate is composed of a P-channel MOS transistor and an N-channel MOS transistor. The circuit configurations of the column selector CSRW(n−1) and the capacitance adding circuit DCRW(n−1) are similar to those of the column selector CSRW0 and the capacitance adding circuit DCRW0, and therefore the explanation is omitted. Note that the transfer gate T217 corresponds to the transfer gate T201. The transfer gate T218 corresponds to the transfer gate T202. The transfer gate T219 corresponds to the transfer gate T203. The transfer gate T220 corresponds to the transfer gate T204.

That transfer gates T201 and T202 have substantially the same size (dimensions). Similarly, the transfer gates T203 and T204, the transfer gates T217 and T218, and the transfer gates T219 and T220 have substantially the same size. Note that the data read operation is similar to that of the circuit shown in FIG. 1, and therefore the explanation is omitted.

Only the data write operation will now be described. The write amplifier WA receives write data externally supplied, and outputs the data to the IO line pair YDT2/YDB2. The write data held by the IO line pair YDT2/YDB2 is written into a target memory cell through a column selector selected from the column selectors SCRW0 to SCRW(n−1) and through the corresponding precharge circuit. The operation of selecting a memory cell is similar to that in the case of data read operation. According to the second embodiment, also the read operation of the circuit used for both read and write operations provides the same operations and effects as those of the first exemplary embodiment.

Figure 7:
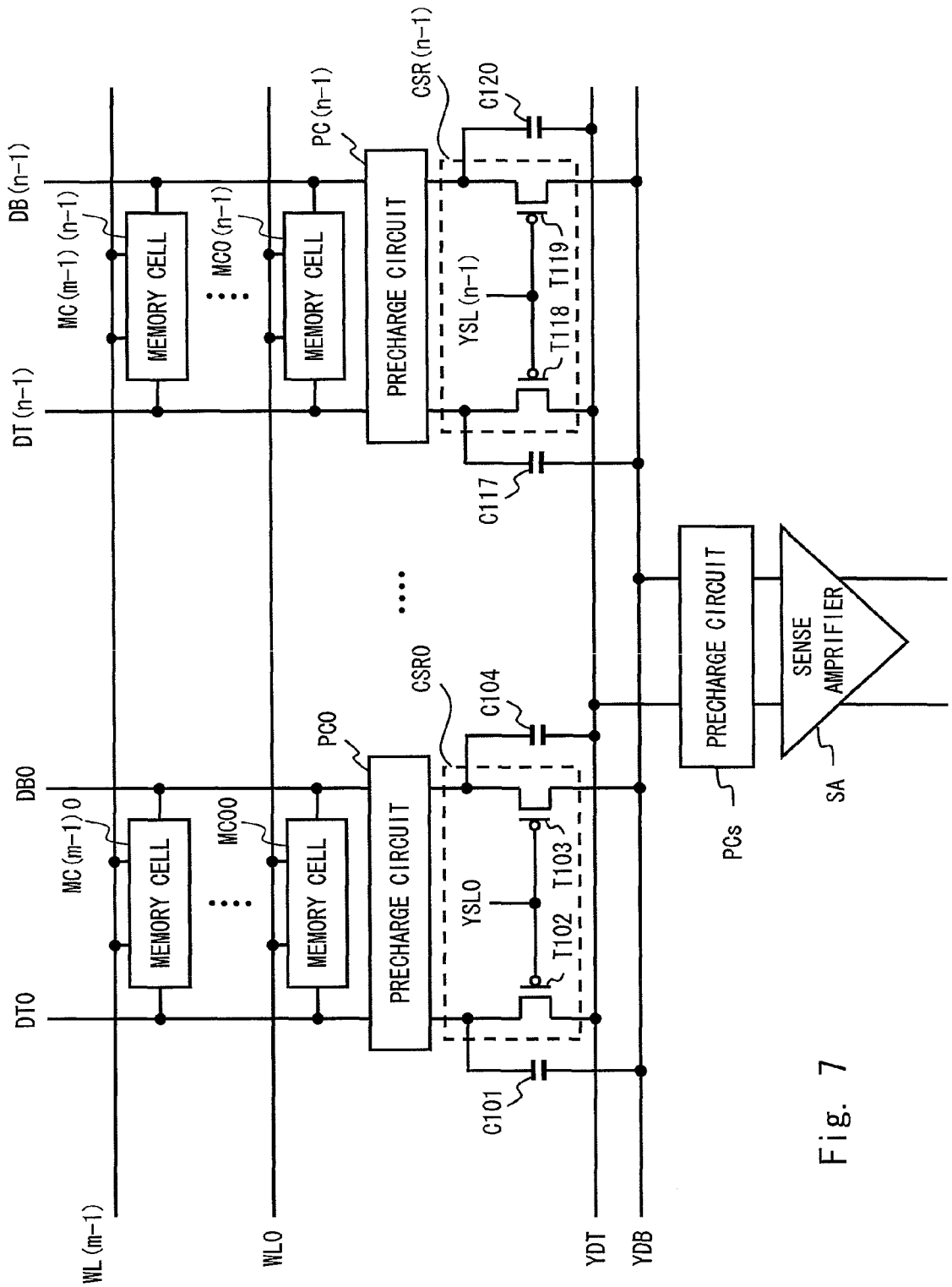
FIG. 7 is a block diagram illustrating a semiconductor memory device according to a third exemplary embodiment of the present invention.
Figure 8:
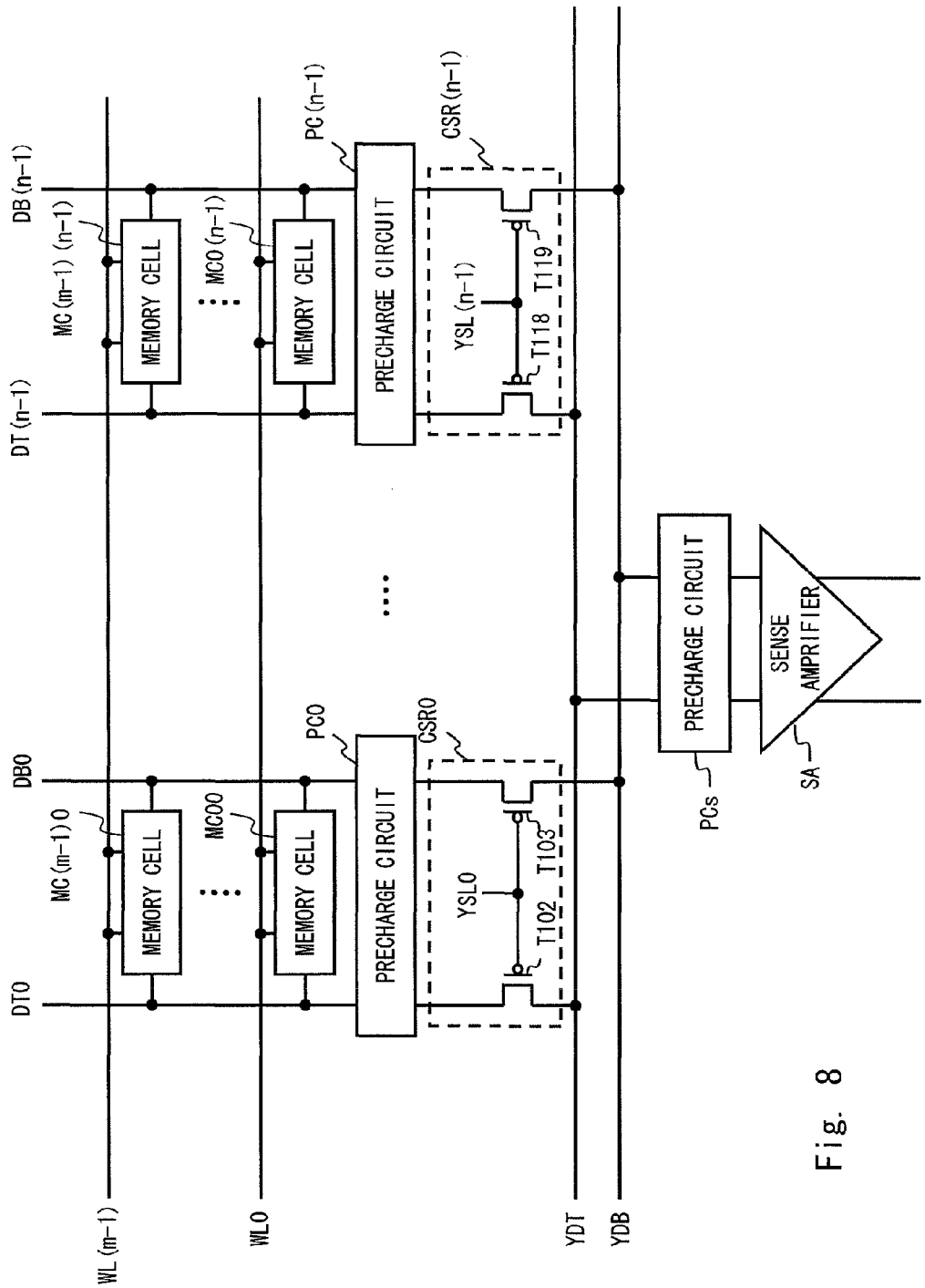
FIG. 8 is a block diagram illustrating a semiconductor memory device according to the related art.
Figure 10A:
FIGS. 10A to 10D illustrate potential variations of bit lines and read lines during reading of data of the semiconductor memory device according to the related art.
Figure 10B:
Figure 10C:
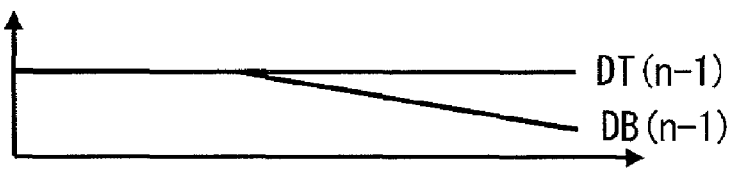
Figure 10D:
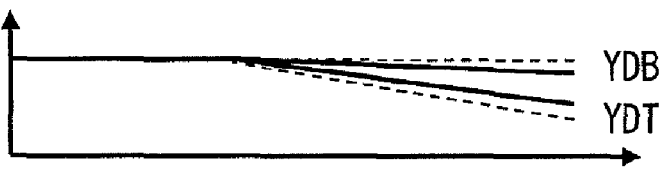
Figure 11:
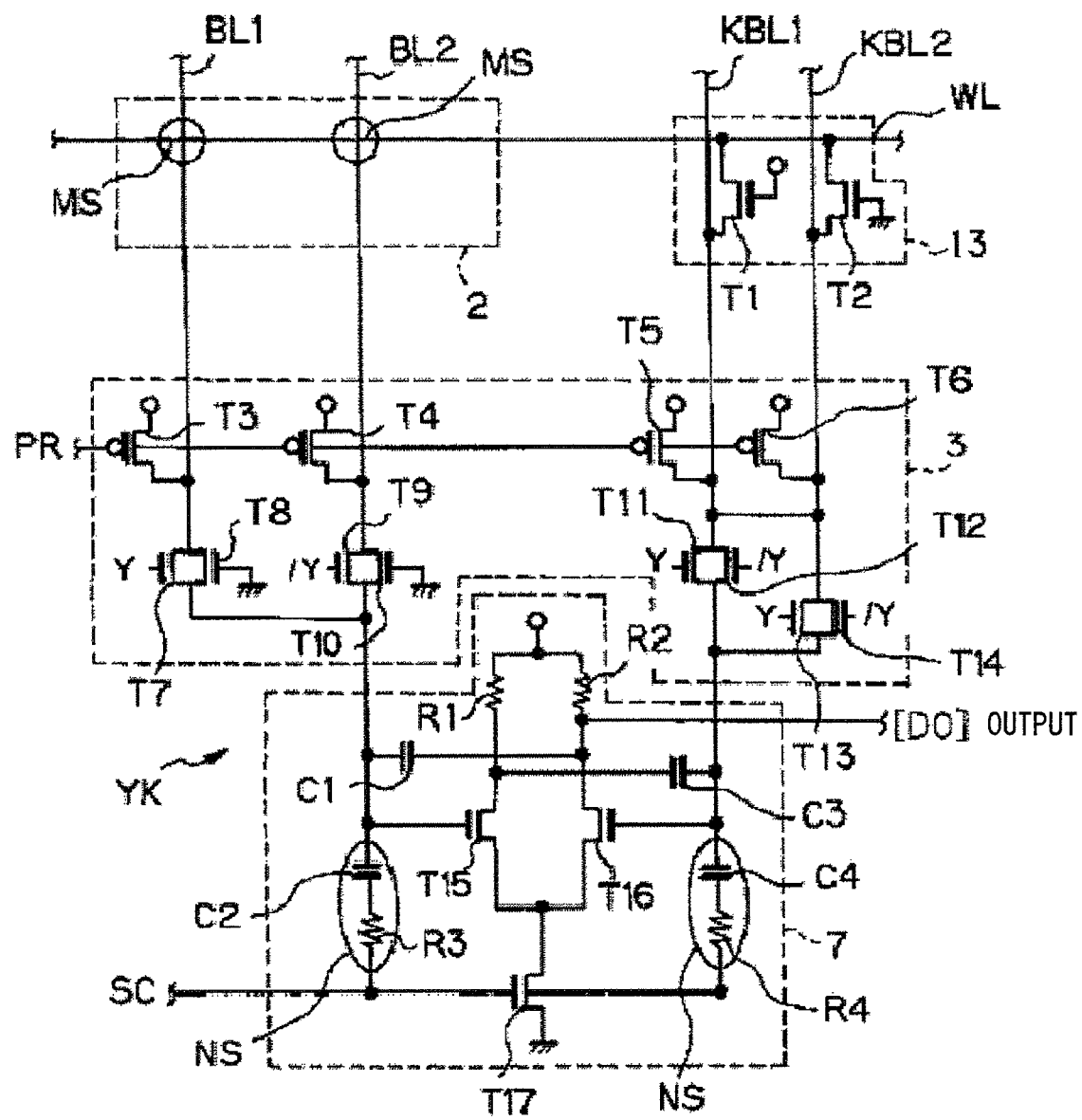
FIG. 11 illustrates a semiconductor memory device according to the related art.
Figure 12A:
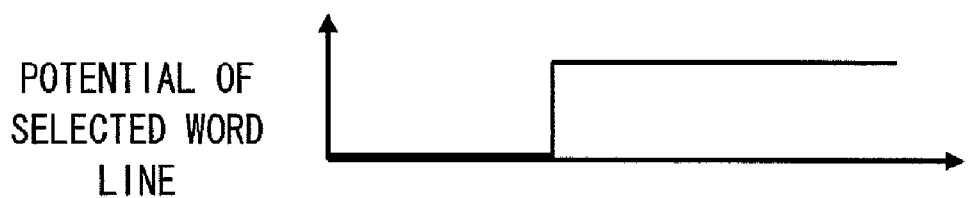
FIGS. 12A to 12E illustrate potential variations of bit lines and input signals of a sense amplifier during reading of data of the semiconductor memory device according to the related art.
Figure 12B:
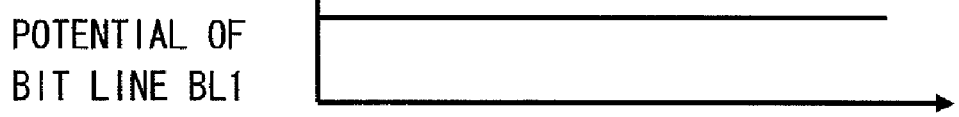
Figure 12C:
Figure 12D:
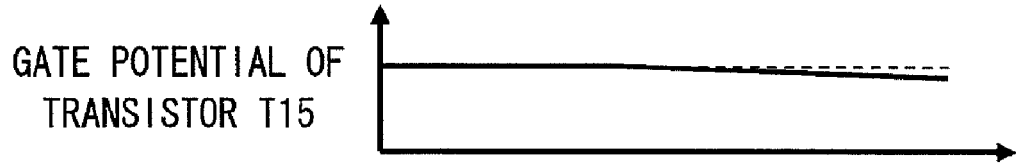
Figure 12E:

Note that the present invention is not limited to the above exemplary embodiments, but can be modified as appropriate within the scope of the present invention. For example, though the above-mentioned exemplary embodiments have described, an example in which the column selectors and the capacitance adding circuits include dummy transistors or dummy transfer gates as dummy elements, the present invention is not limited thereto. The present invention is also applicable to a circuit configuration including capacitive elements (capacitors) which are substantially equal to the parasitic capacitance existing between the source and the drain of the corresponding transistors for selecting column (or the transfer gates for selecting column), as dummy elements. FIG. 7 shows a specific example. The circuit shown in FIG. 7 includes capacitors C101, C104, C117, and C120 respectively in place of the dummy transistors T101, T104, T117, and T120 shown in FIG. 1.

The capacitor C101 has one terminal connected to the bit line DT0, and the other terminal connected to the read line YDB. The capacitor C104 has one terminal connected to the bit line DB0, and the other terminal connected to the read line YDT. The capacitor C117 has one terminal connected to the bit line DT(n−1), and the other terminal connected to the read line YDB. The capacitor C120 has one terminal connected to the bit line DB(n−1), and the other terminal connected to the read line YDT. This circuit configuration also provides the same effects as those of the circuit shown in FIG. 1.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor memory device comprising:
   a plurality of memory cells arranged in a matrix;
   a plurality of word lines each connected to the plurality of memory cells arranged in rows;
   a plurality of bit line pairs each connected to the plurality of memory cells arranged in columns;
   a plurality of column selectors each provided for the corresponding bit line pair;
   a common signal line pair including one common line commonly connected to one of each of the plurality of bit line pairs, and the other common line commonly connected to the other of each of the plurality of bit line pairs;
   a sense amplifier having an input terminal connected to the one common line, and the other input terminal connected to the other common line; and
   a plurality of capacitance adding circuits that balance with parasitic capacitances of the column selectors which are not selected, the capacitance adding circuits being provided respectively between the one of each of the bit line pairs and the other common line and between the other of each of the bit line pairs and the one common line,
   wherein the plurality of column selectors each comprise:
   a first switch element provided between the one of the corresponding bit line pair and the one common line; and
   a second switch element provided between the other of the corresponding bit line pair and the other common line,
   the plurality of capacitance adding circuits corresponding to the column selectors each comprise:
   a first capacitive element provided between the one of the corresponding bit line pair and the other common line; and
   a second capacitive element provided between the other of the corresponding bit line pair and the one common line.

2. The semiconductor memory device according to claim 1, wherein a parasitic capacitance value of each of the column selectors which are not selected and a capacitance value of each of the corresponding capacitance adding circuits are substantially equal to each other.

3. The semiconductor memory device according to claim 1, wherein
   a capacitance value of the first switch element in off state and a capacitance value of the first capacitive element are substantially equal to each other, and
   a capacitance value of the second switch element in off state and a capacitance value of the second capacitive element are substantially equal to each other.

4. The semiconductor memory device according to claim 1, wherein the first switch element and the second switch element are P-channel MOS transistors.

5. The semiconductor memory device according to claim 1, wherein the first capacitive element and the second capacitive element are P-channel MOS transistors controlled to be off.

6. The semiconductor memory device according to claim 5, wherein
the first switch element and the first capacitive element have substantially the same transistor size, and
the second switch element and the second capacitive element have substantially the same transistor size.

7. The semiconductor memory device according to claim 1, wherein the first switch element and the second switch element are transfer gates each including a P-channel MOS transistor and an N-channel MOS transistor.

8. The semiconductor memory device according to claim 1, wherein the first capacitive element and the second capacitive element are transfer gates each including a P-channel MOS transistor controlled to be off and an N-channel MOS transistor controlled to be off.

9. The semiconductor memory device according to claim 1, further comprising a write control circuit that outputs write data to the common signal line pair.

10. A semiconductor memory devise comprising:
a plurality of memory cells arranged in a matrix;
a plurality of word lines each connected to the plurality of memory cells arranged in rows;
a plurality of bit line pairs each connected to the plurality of memory cells arranged in columns;
a pair of common lines including one common line connected to one of each of the plurality of bit line pairs, and the other common line connected to the other of each of the plurality of bit line pairs;
a sense amplifier connected to the pair of common lines;
a first switch element provided between one of a bit line pair of the plurality of bit line pairs and one of the pair of common lines;
a second switch element provided between the other one of the bit line pair and the other one of the pair of common lines;
a first capacitive element provided between one of the bit line pair and one of the pair of common lines; and
a second capacitive element provided between the other one of the bit line pair and the other one of the pair of common lines.

11. The semiconductor memory device according to claim 10, wherein the first switch element and the second switch element are P-channel MOS transistors, and the first capacitive element and the second capacitive element are P-channel MOS transistors each having a gate connected to a power supply.

12. The semiconductor memory device according to claim 11, wherein the first switch element and the second switch element, and the first capacitive element and the second capacitive element are P-channel MOS transistors having substantially the same size.

* * * * *